(12) United States Patent
Chan-Wong et al.

(10) Patent No.: US 6,279,810 B1
(45) Date of Patent: Aug. 28, 2001

(54) PIEZOELECTRIC SENSOR FOR MEASURING BONDING PARAMETERS

(75) Inventors: Lai Wa Chan-Wong; Siu San Chiu; Siu Wing Or; Yiu Ming Cheung, all of Kowloon (HK)

(73) Assignees: ASM Assembly Automation LTD; The Hong Kong Polytechnic University, both of Hong Kong (HK)

( * ) Notice: Subject to any disclaimer, the term of this patent is extended or adjusted under 35 U.S.C. 154(b) by 0 days.

(21) Appl. No.: 09/511,707

(22) Filed: Feb. 23, 2000

(51) Int. Cl.[7] .............................. B23K 1/06; B23Q 15/00
(52) U.S. Cl. .................. 228/1.1; 228/8; 73/579; 73/581
(58) Field of Search ................. 228/1.1–102, 110.1, 228/103, 8; 156/73.1, 580.1; 73/579, 580, 581–582, 862.41, 862.381

(56) References Cited

U.S. PATENT DOCUMENTS

| | | |
|---|---|---|
| 3,794,236 * | 2/1974 | Salzer et al. . |
| 4,040,885 * | 8/1977 | Hight et al. . |
| 4,341,574 * | 7/1982 | Landes . |
| 4,597,519 * | 7/1986 | Kurtz et al. . |
| 4,854,494 * | 8/1989 | von Raben . |
| 5,326,968 * | 7/1994 | Johnson et al. . |
| 5,428,995 * | 7/1995 | Fersht et al. . |
| 5,504,424 * | 4/1996 | Graf et al. . |
| 5,592,078 * | 1/1997 | Giragosian et al. . |
| 5,607,096 * | 3/1997 | Asanasavest . |
| 5,884,835 * | 5/1999 | Kajiwara et al. . |
| 5,962,787 * | 10/1999 | Okada et al. . |
| 6,064,200 * | 5/2000 | Saito et al. . |

* cited by examiner

Primary Examiner—Tom Dunn
Assistant Examiner—Jonathan Johnson
(74) Attorney, Agent, or Firm—Burns, Doane, Swecker & Mathis, L.L.P.

(57) ABSTRACT

A sensor for an ultrasonic bonding apparatus comprises a piezoelectric material located between the ultrasonic transducer and an ultrasonic concentrator of the bonding apparatus. The sensor has at least two outputs for measuring different bonding parameters, the outputs being chosen to optimize the signal response for the bonding parameters in question.

19 Claims, 2 Drawing Sheets

US 6,279,810 B1

PIEZOELECTRIC SENSOR FOR MEASURING BONDING PARAMETERS

FIELD OF THE INVENTION

This invention relates to a piezoelectric sensor for measuring bonding parameters, such as impact force, ultrasonic amplitude and bonding time, in the bonding of components within integrated circuits. The invention also extends to ultrasonic bonding apparatus incorporating such a sensor.

BACKGROUND OF THE INVENTION

In the manufacture of microelectronics products and integrated circuits bonding is a mechanical process that also produces an electrical interconnection between two components (for example between an integrated circuit component and the printed circuit board) by means of a metallic bonding wire (for example aluminium, gold or copper). The bonding process generally involves two stages. In the first stage an ultrasonic bonding apparatus touches down on the contact pad and pre-deforms the bonding wire. Then, in a second sage, a burst of ultrasonic energy is applied by the bonding apparatus. In this second stage the bonding apparatus is vibrated and begins with the tool to move together with the wire and removes an unbondable oxide layer (if any) on the surface. Then the wire is caused to deform after an absorption of ultrasonic energy and pressure and a metallurgical bond is formed at the wire-pad interface.

In both these stages there are parameters tat must be monitored. In the first stage the force of impact and the subsequent force applied to the wire needs to measured and monitored for bond quality assurance purposes. In the second stage, the amplitude of the ultrasonic burst and its duration (known as bonding time) both have a significant effect on bond quality and must therefore also be monitored. An optimized range of these bonding parameters which can guarantee the required quality is usually determined for each different type of bonding machine. To ensure that the parameters remain within this range, however, they must be constantly monitored.

PRIOR ART

U.S. Pat. No. 4,854,494 describes a method for monitoring the bonding parameters by using a piezoelectric sensor that is attached to an ultrasonic concentrator to measure the ultrasonic amplitude, and by using wire strain gauges to monitor the bonding force. In this design, however, two separate sensors are required for monitoring the bonding parameters.

U.S. Pat. No. 4,040,885 describes an apparatus for non-destuctively monitoring the bonding quality of an ultrasonic bonding system by comparing the vibration amplitude of the bonding tool in a freely vibrating (ie no load) condition and during the bonding operation.

SUMMARY OF THE INVENTION

It is an object of the invention to provide a simple apparatus for measuring the bonding parameters and which can be formed as an integral part of the ultrasonic bonding apparatus so that it can readily be transported from one bonding apparatus to another.

According to the present invention there is provided a sensor for measuring bonding parameters in an ultrasonic bonding operation, said sensor comprising piezoelectric material located adjacent an ultrasonic transducer of an ultrasonic bonding apparatus, said sensor having a first output for sensing at least one first bonding parameter, and a second output for sensing at least one second bonding parameter.

By this men a single sensor can be provided which may be used to measure a number of bonding parameters at the same time. Furthermore by locating the sensor adjacent the ultrasonic transducer, the sensor may be formed integrally with the bonding apparatus such that it may be moved with the bonding apparatus from one bonding machine to another. In addition, by providing different signal outputs for different parameters, the outputs may be optimised in their signal response for the different parameters being measured.

In a preferred embodiment of the invention the first output is for sensing impact force, and the second output is for sensing ultrasonic amplitude and bonding rime. Preferably the first output comprises a pair of electrodes oriented in a direction parallel to the direction of the applied impact force which is along the direction of motion of the bonding tool, and wherein the second output comprises a pair of electrodes oriented transversely to the direction of the applied impact force.

The electrodes may be applied to a single piece of piezoelectric material This piece of piezoelectric material may be generally annular in shape and the electrodes may be disposed about the piezoelectric material at 90° intervals. However, other shapes for the piezoelectric material, for example square or rectangular, may also be possible.

Preferably signal processing means are provided for processing the signals output from the fist and second outputs, the processing means comprising means for separating the two signals. The signal processing means may comprise a low pass filter for the signal output from the first signal output, and a high pass filter and a harmonic filter means for the signal output from the second signal output. The signal processing means may also comprise signal amplifying means.

It will also be understood that the present invention also extends to bonding apparatus incorporating such a sensor, and accordingly therefore viewed from another broad aspect the present invention provides ultrasonic bonding apparatus comprising, an ultrasonic transducer and an ultrasonic concentrator, said apparatus flier including a sensor comprising piezoelectric material located adjacent said transducer, said sensor having a first output for sensing at least one first bonding parameter, and a is second output for sensing at least one second bonding parameter.

BRIEF DESCRIPTION OF THE DRAWINGS

An embodiment of the invention will now be described by way of example and with reference to the accompanying drawings, in which.

DETAILED DESCRIPTION OF PREFERRED EMBODIMENT

Figure 1:
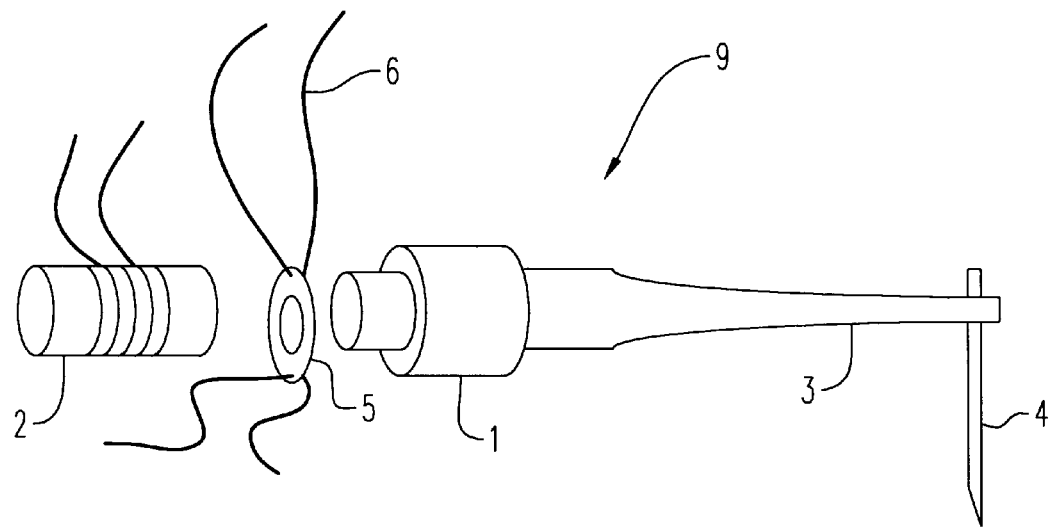
FIG. 1 is a perspective part-exploded view of an ultrasonic bonding apparatus incorporating a sensor according to an embodiment of the invention.

Referring firstly to FIG. 1 there is shown an ultrasonic bonding apparatus incorporating a sensor 5 according to a preferred embodiment of the invention. The bonding apparatus 9 comprises a mounting flange 1, ultrasonic transducer 2, ultrasonic concentrator 3, and a bonding tool 4 that may be in the form of a capillary or wedge. The ultrasonic transducer 2 may be a piezoelectric Langevin type sandwich transducer, but any appropriate transducer known in the art may be employed. The transducer 2 is used to generate vibrations at an ultrasonic frequency that are then amplified by the concentrator 3 before driving the bonding tool 4. As described above the bonding apparatus is conventional.

Figure 2:
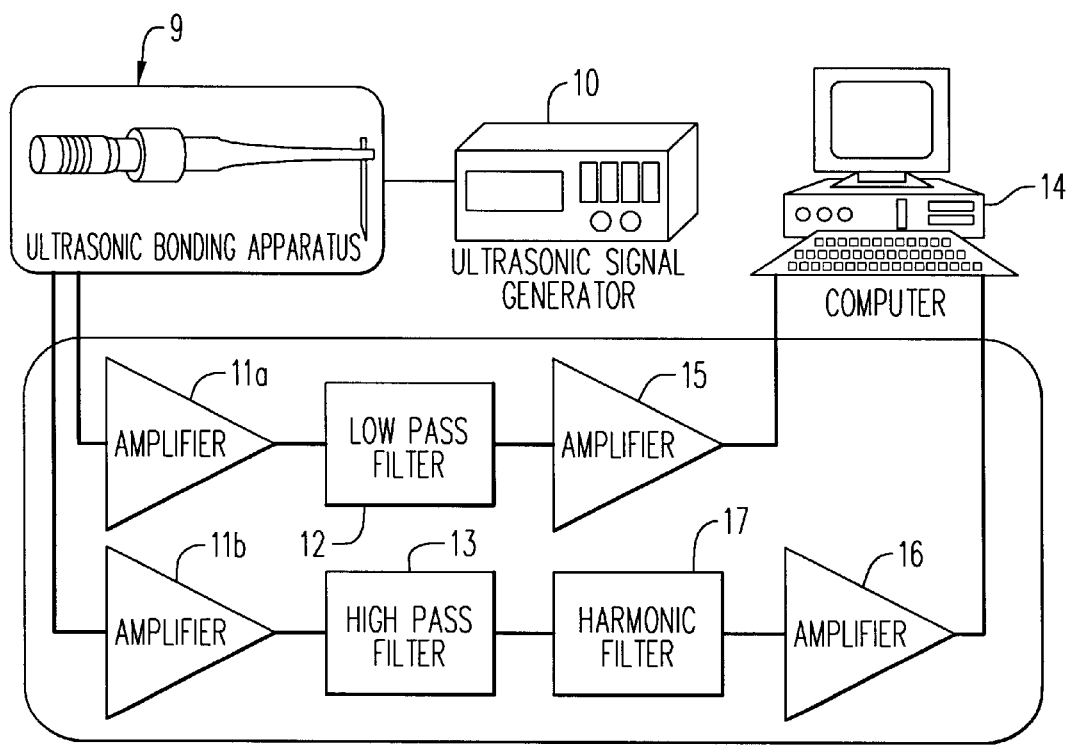
FIG. 2 is a schematic view of the bonding apparatus and the connections to other components of the system.

In this embodiment of the present invention, however, a sensor 5 is formed as an integral part of the bonding apparatus 9 and located between the transducer 2 and the concentrator 3. In use of the bonding apparatus 9, as shown in FIG. 2, the transducer 2 receives an input from an ultrasonic signal generator 10, while outputs from the sensor 5 (which will be described in more detail below) are first fed to amplifiers 11a, 11b and to low and high pass filters 12,13 respectively in a manner to be described below and then to a computer 14 after passing through flier amplifiers 15,16. As will be described below the outputs from the sensor 5 may be used to monitor the critical bonding parameters and to provide a controlling feedback signal to the ultrasonic signal generator 10. In particular the computer 14 may store a range of acceptable values for each bonding parameter and may be provided with means for comparing with measured bonding parameters with these ranges. When the measured parameters differ from the acceptable ranges a controlling feedback signal may be generated to bring them back within range.

Figure 3:
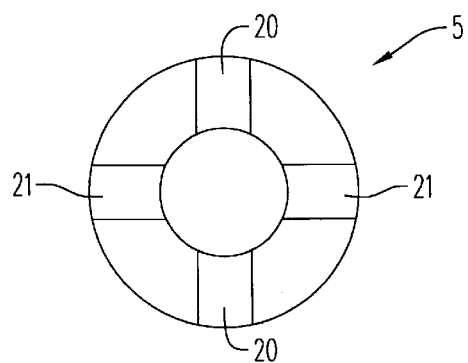
FIG. 3 is a view of the sensor in cross-section.
Figure 4:
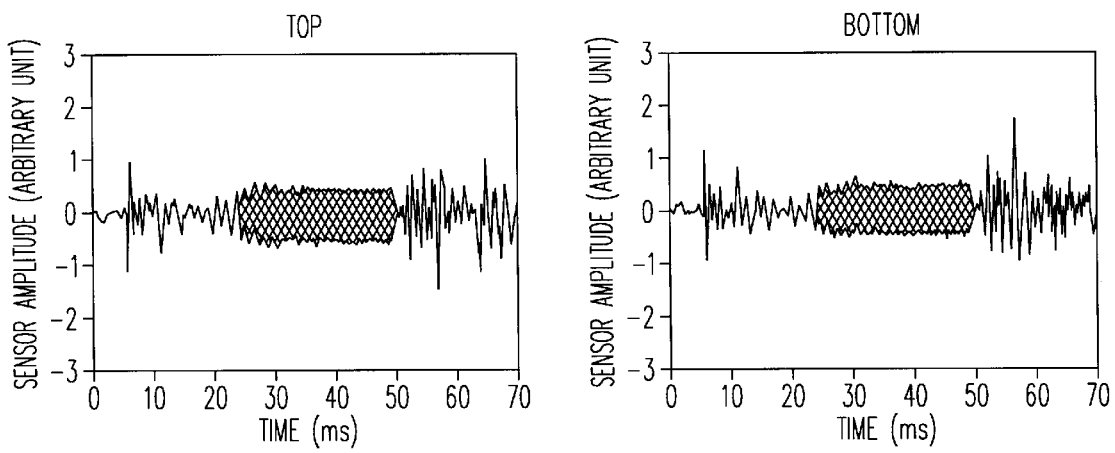
FIG. 4 shows schematically a first output of the sensor.
Figure 5:
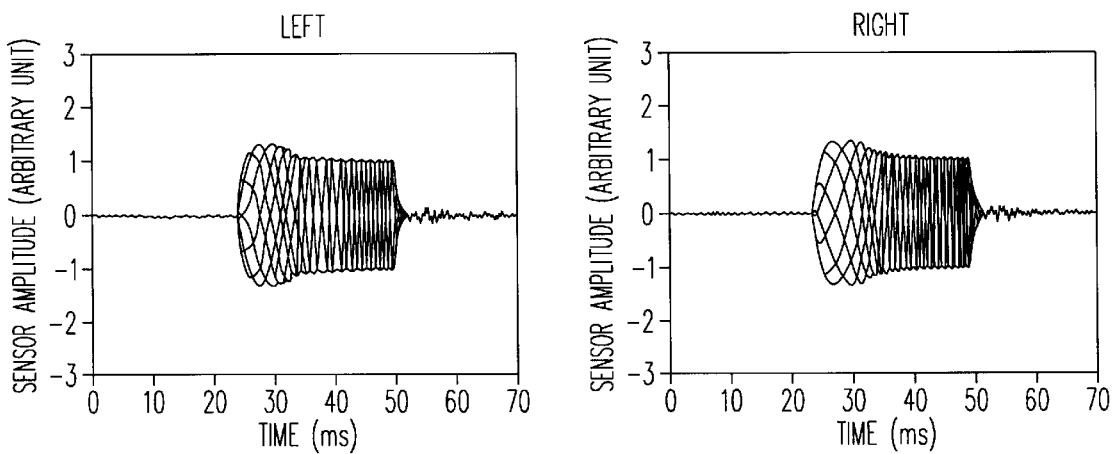
FIG. 5 shows schematically a second output of the sensor.

As shown in FIG. 3 the sensor 5 comprises a ring of piezoelectric material (any suitable piezoelectric material may be used) to which two pairs of electrodes 20,21 are attached by any suitable means (eg co-firing, electroplating, sputtering, evaporation, electrochemical deposition). A first pair of electrodes 20 are disposed vertically so that they lie on a line parallel to the bonding tool 4. The second pair of electrodes 21 are disposed horizontally, ie transverse to the bonding tool 4. On the reverse side of the sensor is provided a common ground plane to which and therefore an output signal may be taken from each of the electrodes of the pairs 20,21. FIG. 4 shows a typical output signal from the first, vertical pair of electrodes 20, while FIG. 5 shows a typical output signal from the second, horizontal pair of electrodes 21.

The two pairs of electrodes 20,21 are used to sense different parameters. The vertical pair 20 are used to sense the impact force. These electrodes are more responsive to a bending moment of the bonding apparatus 9 caused by contact of the bonding tool 4 with the wire to be bonded to a contact pad because of the fact that they are aligned vertically with the bonding tool 4. FIG. 4 shows a typical output from these electrodes, with the output taken either from the upper or the lower of the two electrodes 20 in the pair. The second horizontally disposed electrode pair 21 are used for measuring the ultrasonic amplitude and the bonding time.

FIG. 4 shows a typical output of the first electrode pair 20. It will be seen that a signal is detected (in the Figure beginning at approximately 5 ms on horizontal axis) as soon as the bonding tool 4 contacts the wire and starts to deform the wire against the contact pad. The amplitude of this signal can be used to determine the impact force. The signal also shows a solid uniform response when the ultrasonic burst is later applied. FIG. 5 in contrast shows the typical signal from the second, horizontally disposed electrode pair 21. It will be noted that the output signal from this pair shows only a very small signal at the point where The bonding tool 4 makes contact to the surface because of the fact that these electrodes are disposed transversely to the tool 4 and so are not sensitive to detect the bending moments of the bonding apparatus 9 during contact. However, the second pair 21 provide a stronger and cleaner signal in response to the ultrasonic burst and this sensor pair are used to measure the amplitude of the ultrasonic burst and the bonding time.

Referring back to FIG. 2, the output from the first electrode pair 20 is fed to an amplifier 11a and then to a low-pass (eg 4 kHz) filter 12 to remove ultrasonic vibrations and then is amplified by amplifier 15. As discussed above this signal may then be used to determine the impact force. The signal from the second electrode pair 21 on the other hand is amplified by amplifier 11b and then passed to a high-pass filter 13, optionally harmonic filter 17, and then to an amplifier 16, This signal is used to measure the ultrasonic amplitude and the bonding time.

It will be understood that other electrode structures may be used and the present invention is not limited to that shown in FIG. 3. For example, multiple electrodes may be used and then averaged to provide the output signals. The electrodes may also be formed as substantial circumferential arc segments around the circumference of the annular piezoelectric material. Many designs will be readily understood by one skilled in the art. What is important is that vertically oriented electrodes are provided oriented parallel to the bonding tool 4 to provide an output for measuring impact force, while horizontally oriented electrodes transverse to the bonding tool 4 are used to determine the ultrasonic amplitude and the bonding time.

In the embodiment described above the two electrode pairs are formed on the same piece of piezoelectric material. It will be understood, however, that alternatively the piezoelectric element may be split into two pieces each bearing a respective electrode pair.

What is claimed is:

1. A sensor for measuring bonding parameters in an ultrasonic bonding operation, said sensor comprising piezoelectric material located adjacent an ultrasonic transducer of an ultrasonic bonding apparatus, said sensor having a first output comprising a pair of electrodes oriented in a direction parallel to the direction of the applied impact force for sensing impact force, and a second output comprising a pair of electrodes oriented transversely to the direction of the applied impact force for sensing ultrasonic amplitude and bonding time.

2. A sensor as claimed in claim 1 wherein said electrodes are applied to a single piece of piezoelectric material.

3. A sensor as claimed in claim 2 wherein said piezoelectric material is generally annular in shape and said electrodes are disposed about said piezoelectric material at regular intervals.

4. A sensor as claimed in claim 3 wherein said electrodes are disposed at 90° intervals.

5. A sensor as claimed in claim 1 further comprising signal processing means for processing the signals output from said first and second outputs, said processing means comprising means for separating the two signals.

6. A sensor as claimed in claim 5 wherein the signal processing means comprises a low pass filter for the signal output from said first signal output.

7. A sensor as claimed in claim 5 wherein the signal processing means comprises a high pass filter and a harmonic filter means for the signal output from said second signal output.

8. A sensor as claimed in claim 5 wherein said signal processing means comprises signal amplifying means.

9. Ultrasonic bonding apparatus comprising, an ultrasonic transducer and an ultrasonic concentrator located along an axis, said apparatus further including a sensor comprising piezoelectric material and being integrally formed as part of said apparatus, said sensor being located on said axis between said ultrasonic transducer and said ultrasonic concentrator adjacent said transducer, said sensor having a first output for sensing at least one first bonding parameter, and a second output for sensing at least one second bonding parameter.

10. Apparatus as claimed in claim 9 wherein said first output is for sensing impact force, and said second output is for sensing ultrasonic duration and amplitude.

11. Apparatus as claimed in claim 10 wherein said first output comprises a pair of electrodes oriented in a direction parallel to the direction of the applied impact force, and wherein said second output comprises a pair of electrodes oriented transversely to the direction of the applied impact force.

12. Apparatus as claimed in claim 11 wherein said electrodes are applied to a single piece of piezoelectric material.

13. Apparatus as claimed in claim 12 wherein said piezoelectric material is generally annular in shape and said electrodes are disposed about said piezoelectric material at regular intervals.

14. Apparatus as claimed in claim 13 wherein said electrodes are disposed at 90° intervals.

15. Apparatus as claimed in claim 9 further comprising signal processing means for processing the signals output from said first and second outputs, said processing means comprising means for separating the two signals.

16. Apparatus as claimed in claim 14 wherein the signal processing means comprises a low pass filter for the signal output from said first signal output.

17. Apparatus as claimed in claim 14 wherein the signal processing means comprises a high pass filter and a harmonic filter means for the signal output from said second signal output.

18. Apparatus as claimed in claim 14 wherein said signal processing means comprises signal amplifying means.

19. Apparatus as claimed in claim 9 further comprising computing means, said computing means comprising means for storing desired bonding parameters, means for comparing said measured parameters with said desired parameters and for generating feedback control signals.

* * * * *